United States Patent [19]
Tran

[11] Patent Number: 6,094,393
[45] Date of Patent: Jul. 25, 2000

[54] STACKED SENSE-AMP CACHE MEMORY SYSTEM AND METHOD

[75] Inventor: Hiep V. Tran, Dallas, Tex.

[73] Assignee: Texas Instruments Incorporated, Dallas, Tex.

[21] Appl. No.: 09/363,517

[22] Filed: Jul. 29, 1999

Related U.S. Application Data

[60] Provisional application No. 60/096,699, Jul. 31, 1998.

[51] Int. Cl.$^7$ ..................................................... G11C 7/00
[52] U.S. Cl. ........................... 365/205; 365/207; 365/208
[58] Field of Search ................................... 365/205, 207, 365/208, 190

[56] References Cited

U.S. PATENT DOCUMENTS

| | | | |
|---|---|---|---|
| 4,825,413 | 4/1989 | Tran | 365/189.11 |
| 4,862,421 | 8/1989 | Tran | 365/189.07 |
| 4,939,693 | 7/1990 | Tran | 365/190 |
| 4,961,168 | 10/1990 | Tran | 365/189.11 |
| 4,984,196 | 1/1991 | Tran et al. | 365/51 |
| 4,991,141 | 2/1991 | Tran | 365/207 |
| 5,091,879 | 2/1992 | Tran | 365/177 |
| 5,093,806 | 3/1992 | Tran | 365/189.11 |
| 5,291,444 | 3/1994 | Scott et al. | 365/189.05 |
| 5,550,777 | 8/1996 | Tran | 365/205 |
| 5,638,317 | 6/1997 | Tran | 365/63 |
| 5,724,294 | 3/1998 | Khieu | 365/207 |
| 6,061,534 | 1/2000 | Kumar et al. | 365/207 |

OTHER PUBLICATIONS

S. Narita, K. Ishibashi, S .Tachibana, K. Norisue, Y. Shimazaki, J. Nishimoto, K. Uchiyama, T. Nakazawa, K. Hirose, I. Kudoh, R. Izawa, S. Matsui, S. Yoshioka, M. Yamamoto, I. Kawasaki, "A low–power single–chip microprocessor with multiple page–size MMU for nomadic computing," 1995 Symposium on VLSI Circuits Digest of Technical Papers, pp. 59–60.

*Primary Examiner*—Trong Phan
*Attorney, Agent, or Firm*—Carlton H. Hoel; Robby T. Holland; Frederick J. Telecky, Jr.

[57] ABSTRACT

A stacked sense-amp cache memory system and method is provided. The stacked sense-amp cache memory system (10) may comprise a memory cell array (22) coupled to a cache system (30). The memory cell array (22) stores and retrieves a data signal. Recently retrieved data signals are stored in the cache system (30). A column select system (32) is coupled to the cache system (30). A logic subsystem (12) controls the column select system (32) such that the column select system (32) directs the data signal from the memory cell array (22) to a sense-amp system (34) or directs a stored data output signal from the cache system (30) to a switching system (36). The sense-amp system (34) senses and amplifies the data signal and produces an amplified data output signal. The switching system (36) is coupled to the sense-amp system (34) and the cache system (30) and operates to select between the amplified data output signal from the sense-amp system (34) and the stored data output signal from the cache system (30).

17 Claims, 2 Drawing Sheets

STACKED SENSE-AMP CACHE MEMORY SYSTEM AND METHOD

RELATED APPLICATIONS

This application is related to a provisional application entitled Stacked Cache Memory System and Method, filed Jul. 31, 1998, having a Ser. No. of 60/096,699, and an attorney docket number of TI-21664.

TECHNICAL FIELD OF THE INVENTION

The present invention relates generally to memory systems, and more particularly to a stacked sense-amp cache memory system and method.

BACKGROUND OF THE INVENTION

Memory systems are used in nearly all microprocessor and digital equipment applications. Memory systems generally utilize different types of memory for different applications. Memory systems generally include a memory array that has a large number of memory cells arranged in an array of rows and columns. Each memory cell has a specific address that corresponds to its respective row and column. Retrieving data from an individual memory cell is generally accomplished by activating the respective row of memory cells and then reading only the respective column to obtain the data in the memory cell.

The power required to operate the memory system is a primary concern in most applications. For example, in limited power applications, such as a battery powered laptop computer, power requirements are of critical importance. One type of memory system often used in microprocessor applications is a static random access memory (SRAM) system.

SRAM systems comprise a memory cell array composed of SRAM memory cells. A wordline is associated with each row of SRAM memory cells, and a pair of bitlines are associated with each column of SRAM memory cells. Each SRAM memory cell includes a pair of complementary ports, with each port coupled to one of two bitlines dedicated to that column of SRAM memory cells.

When writing, or storing data, in a SRAM memory cell, the appropriate wordline is activated, thereby activating the entire row of memory cells in the SRAM memory cell array. A differential current is applied to the appropriate complementary bitlines that connect to each respective port of the SRAM memory cell. The SRAM memory cell is then latched to a specific logic state with a logic high indicated on one port and a logic low indicated on the other port. When reading from a SRAM system, the appropriate wordline is activated and the logic states on the bitlines associated with the memory cell are differentially sensed using a sense amplifier. The sense amplifier outputs an amplified data output signal that corresponds to the logic state written to the memory cell.

Activating the SRAM memory cells to retrieve the stored data requires time and uses power. Time and power are each valuable commodities in a memory system and must be minimized.

SUMMARY OF THE INVENTION

Accordingly, a need has arisen in the art for an improved memory system. The present invention provides a stacked sense-amp cache memory system and method that substantially reduces or eliminates problems associated with prior systems and methods.

In accordance with one embodiment of the present invention, the stacked sense-amp cache memory system comprises a memory cell array that operates to store and output data signals. A cache system is coupled to the memory cell array and comprises a number sense-amp memory cell that operates to store the data signals recently output by the memory cell array. The cache system can also produce a stored data output signal. A column select system is coupled to the cache system. The column select system operates to select a single data signal from the memory cell array or a single stored output data signal from the cache system. A sense-amp system is coupled to the column select system and operates to sense and amplify the selected data signal from the column select system and output an amplified data output signal. A switching system is coupled to the cache system and the sense-amp system, and operates to switch between the amplified data output signal of the sense-amp system or the stored data output signal of the cache system.

The present invention provides several technical advantages. For example, the present invention reduces the power required to operate a memory system. The memory cell array and the sense-amp system is only activated when the cache system does not contain the data signal requested, thereby saving power. Accordingly, a battery powered device can operate over an extended period.

In addition, the present invention provides the technical advantage of high speed access to data signals that are frequently accessed. Accordingly, the processing speed of the memory system may be increased.

Other technical advantages will be readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

Figure 1:
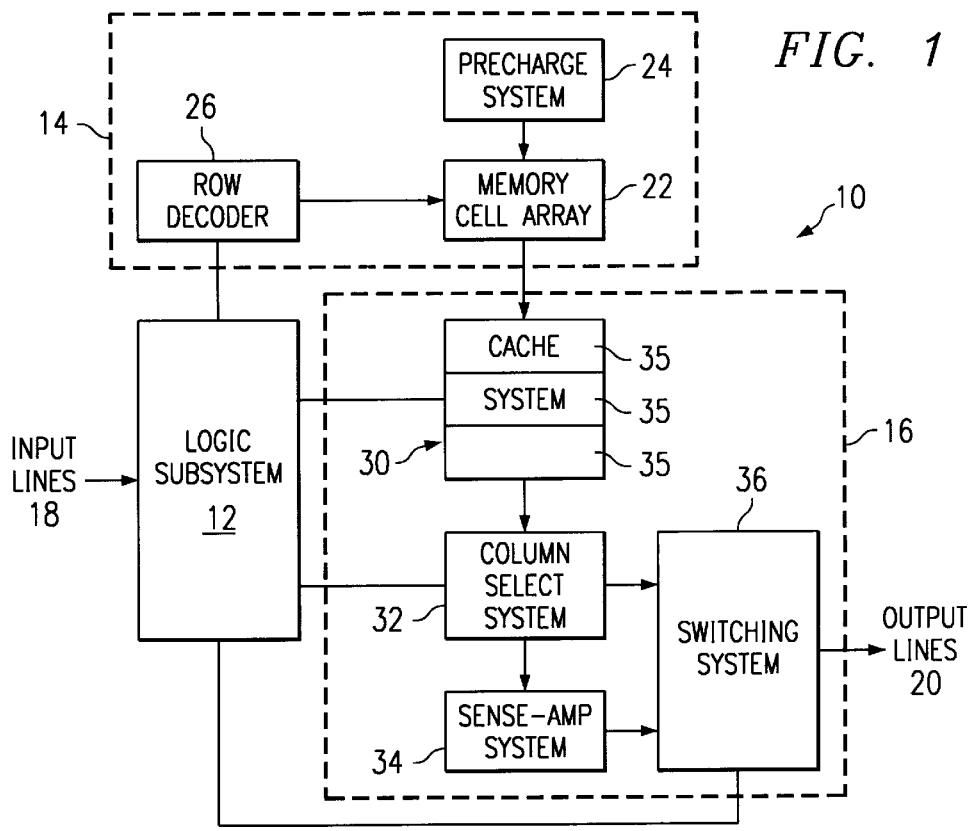
FIG. 1 is a block diagram illustrating a stacked sense-amp cache memory system in accordance with the present invention.
Figure 3:
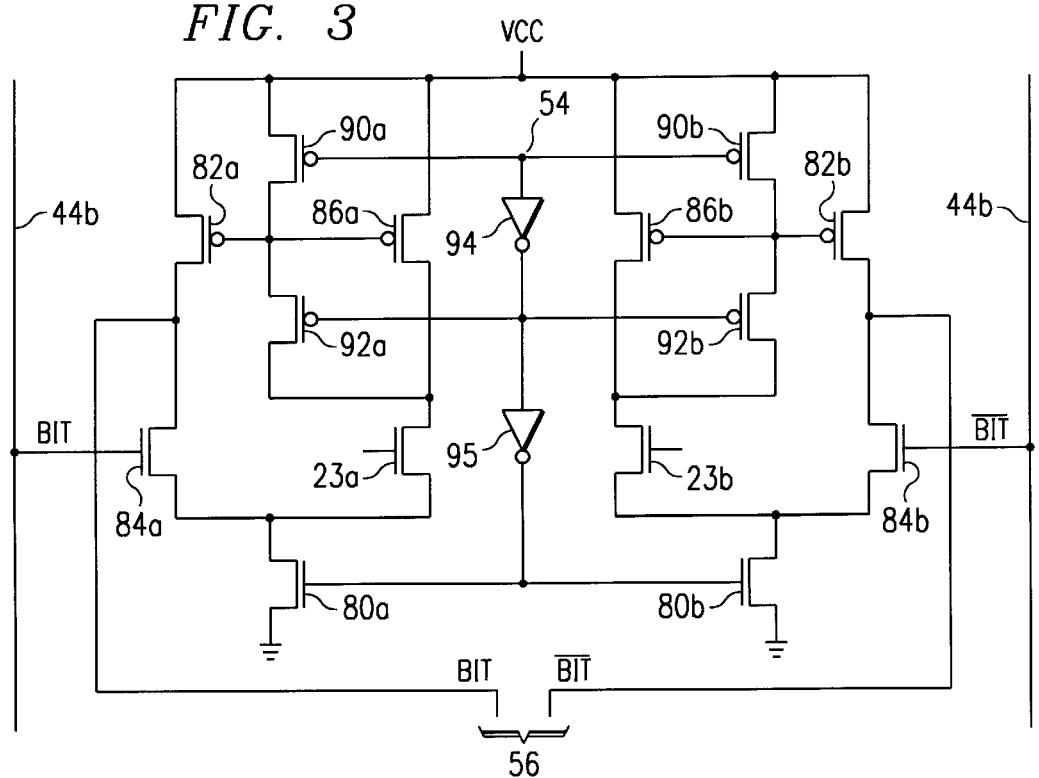
FIG. 3 is a schematic diagram of a sense-amp memory cell in accordance with the present invention.
Figure 2:
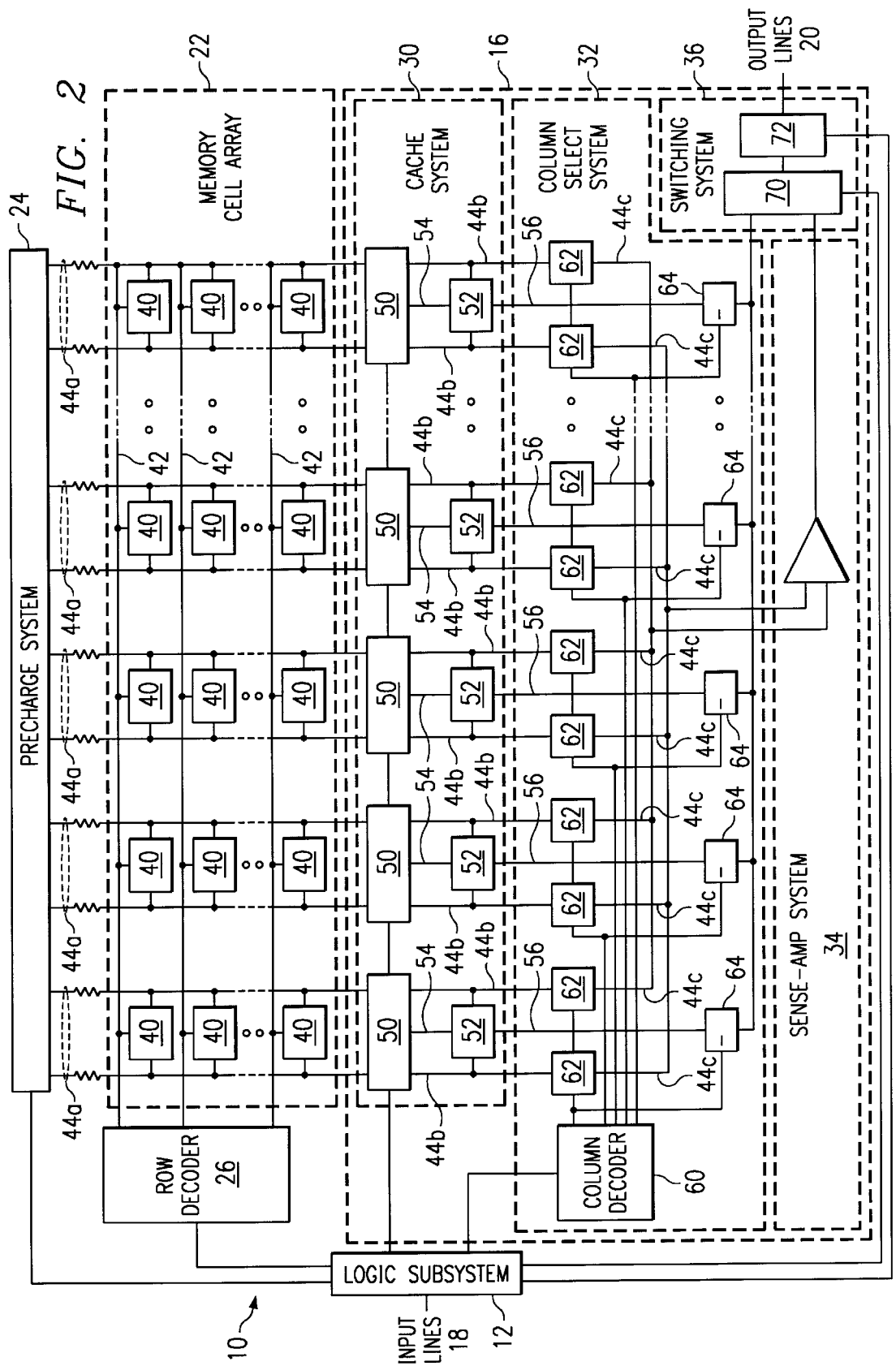
FIG. 2 is a schematic diagram illustrating a stacked sense-amp cache memory system in accordance with the present invention.

FIGS. 1 through 3 illustrate a stacked sense-amp cache memory system in accordance with the present invention. Although the present invention is described in terms of a static random access memory (SRAM) system, the present invention may be used in other suitable types of memory systems, such as dynamic random access memory (DRAM) systems, 1T DRAM systems, 4T SRAM systems, or other suitable memory systems.

As described in more detail below, the stacked sense-amp cache memory system includes a memory cell array, a cache system, and a sense-amp system. The memory cell array includes a number of memory cells arranged in rows and columns. The cache system comprises at least one cache level that has a sense-amp memory cell associated with each column of memory cells in the memory cell array. Each time a row of memory cells in the memory cell array is activated to retrieve a data signal stored in a specific memory cell, each sense-amp memory cell corresponding to each column of memory cells stores the data signal from the corresponding memory cell in the entire row of memory cells. Thus, the cache system temporarily stores the data signals from the most recently accessed row of memory cells. When a data signal from a row that is not stored in the cache system is requested, the memory cell array is activated to retrieve the data signal, and the data signal is directed through the sense-amp system to obtain an amplified data signal. When a data signal from a row that has been stored in the cache system is requested, a stored data output signal is output directly from the cache system without the need to activate the memory cell array or the sense-amp system. Power consumption is thereby reduced by reducing the number of times that the memory cell array and the sense-amp system is activated. In addition, the average time required to retrieve a data signal from the memory cell array may be reduced, thereby increasing the processing speed of the memory system.

FIG. 1 is a block diagram illustrating a stacked sense-amp memory system 10 in accordance with one embodiment of the present invention. In the embodiment illustrated in FIG. 1, the memory system 10 includes a logic subsystem 12, a memory array subsystem 14, and a control subsystem 16. Input lines 18 and output lines 20 are coupled to the memory system 10. The input lines 18 and output lines 20 allow command and data communication between the memory system 10 and the other system components (not expressly shown). The logic subsystem 12 controls the operation of the memory array subsystem 14 and the control subsystem 16. As will be discussed in greater detail below, the memory array subsystem 14 operates as a mass memory device and the control subsystem 16 operates both as an amplifier and temporary memory. The memory system 10 may include other suitable components and devices without departing from the scope of the present invention.

In one embodiment, the memory array subsystem 14 comprises a memory cell array 22, a precharge system 24, and a row decoder 26. As will be discussed in greater detail below, the memory cell array 22 generally comprises an array of memory cells arranged in rows and columns. Each row and column of memory cells has an associated address that identifies the specific row and column such that every memory cell in the memory cell array 22 can be identified by its row and column address. Each memory cell in the memory cell array 22 operates to store a logic state of a data signal. In other words, the memory cell stores a charge that is associated with the logic state of "0" or "1."

The precharge system 24 is coupled to the logic subsystem 12 and the memory cell array 22. The precharge system 24 operates to precharge the memory cells within the memory cell array 22. In one embodiment, the precharge system 24 is a bank of pull-up transistors (not expressly shown). In this embodiment, the bank of pull-up transistors receives clocked input data from the logic subsystem 12. It will be understood that the precharge system 24 may include other suitable devices or systems depending on the type of the memory cell array 22 used in the memory system 10.

The row decoder 26 is coupled to the logic subsystem 12 and the memory cell array 22. The row decoder 26 operates to activate a specific row of memory cells within the memory cell array 22 in response to a command from the logic subsystem 12. In particular, the row decoder 26 receives address information from the logic subsystem 12. The address information identifies a specific row in the memory cell array 22 to be selected. The row may be selected for either a read or write operation. The total number of individual memory cells activated depends on the size of the memory cell array 22. For example, in a typical 1M memory array, the memory cell array 22 may be organized into 512 rows and 2048 columns. In this example, selecting any row activates 2048 memory cells and produces a data signal from each of the 2048 columns of memory cells.

The memory array subsystem 14 may include other suitable devices and systems without departing from the scope of the present invention. For example, in an embodiment utilizing dynamic random access memory (DRAM), the memory array subsystem 14 may incorporate a refresh system (not shown) that refreshes the charge stored within each memory cell of the memory cell array 22.

The control subsystem 16, as illustrated in FIG. 1, includes a cache system 30, a column select system 32, a sense-amp system 34, and a switching system 36. The cache system 30 is coupled to the memory cell array 22, the logic system 12, and the column select system 32. As will be discussed in greater detail below, the cache system 30 operates to receive and temporarily store the data signals from each column of memory cells in the memory cell array 22.

In one embodiment, the cache system 30 comprises a single cache level 35. In this embodiment, the cache system 30 stores only the most recent set of data signals from the memory cell array 22 and discards the previously stored set of data signals. In another embodiment, the cache system 30 comprises multiple cache levels 35 that allow more than a single set of data signals to be stored in the cache system 30. In this embodiment, each cache level 35 stores the data signals from a recently accessed row of memory cells. For example, the cache system 30 may comprise five cache levels 35 that allow the cache system 30 to store the five sets of data signals that correspond to the five most recent times the memory cell array 22 has been accessed. It will be understood that the cache system 30 may comprise any suitable number cache levels 35 without departing from the scope of the present invention.

The column select system 32 is coupled to the cache system 30, the logic subsystem 12, the sense-amp system 34, and the switching system 36. The column select system 32 operates as a switching system that switches between the cache system 30 and the sense-amp system 34. Specifically, when the information requested from the memory system 10 has a row address that is the same as the address of a row that is stored in the cache system 30, the column select system 32 directs a stored data output signal from the cache system 30 to the switching system 36. When the information requested from the memory system 10 has a row address that is not the same as the rows stored in the cache system 30, the memory cell array 22 is activated and the column select system 32 directs the data signal from the appropriate column of memory cells in the memory cell array 22 to the sense-amp system 34.

The sense-amp system 34 is optional and is generally required only in SRAM applications. The sense-amp system 34 is coupled to the column select system 32 and the switching system 36. The sense-amp system 34 operates to sense the data signal switched from the memory cell array 22, and produce an amplified data output signal that is then directed to the switching system 36.

The switching system 36 is coupled to the column select system 32, the sense-amp system 34, the logic subsystem 12, and the output lines 20. As will be described in greater detail below, the switching system 36 switches between the output of the column select system 32 and the sense-amp system 34. In other words, the switching system 36 couples the output lines 20 to the column select system 32 when the cache system 30 contains the requested information so that the stored data output signal corresponding to the requested information is output on the output lines 20. Correspondingly, the switching system 36 couples the output lines 20 to the sense-amp system 34 when the cache system 30 does not contain the requested information so that the amplified data output signal from the sense-amp system 34 is output on the output lines 20.

The switching system 36 may also comprise one or more memory output cells that operates to save the most recently retrieved data output signals. For example, the switching system 36 may comprise ten memory output cells such that the ten most recent data output signals retrieved from the memory system 10. In this example, when the logic system 12 determines that the requested data signal is contained in the switching system 36, memory data output signal from the appropriate memory output cell is switched to the output lines 20 without the other components of the memory system 10 being activated.

The logic subsystem 12 is coupled to the memory array subsystem 14, the cache system 30, the column select system 32, and the switching system 36, as well as the input lines 18. The logic subsystem 12 receives command signals and data signals on the input lines 18. In response to the command and data signals, the logic subsystem 12 controls the operation of the individual components within the memory system 10 to either store or access data signals in the memory array subsystem 14 or the control subsystem 16. In particular, when the logic subsystem 12 receives a command signal to read, or access, a data signal stored in the memory array subsystem 14, the logic subsystem 12 determines whether or not the requested data signal is temporarily stored in the cache system 30. If the cache system 30 contains the requested data signal, the logic subsystem 12 activates the cache system 30 and the column select system 32 to direct the requested stored data output signal from the cache system 30 to the switching system 36. The logic subsystem 12 communicates with the switching system 36 to direct the requested data output signal from the column select system 32 to the output lines 20. If the cache system 30 does not contain the requested data signal, the logic subsystem 12 communicates with the row decoder 26 to activate the particular row containing the requested data signal. The data signal contained in each memory cell in the row of memory cells is communicated to the cache system 30. The logic subsystem 12 controls the cache system 30 such that the data signals from the entire row are temporarily stored in the cache system 30. The logic subsystem 12 also controls the switching system 36 such that requested data signal from the requested column in the memory cell array 22 is directed to the sense-amp system 34. As discussed previously, the sense-amp system 34 senses the data signal from the memory cell array 22 and produces an amplified data output signal. The data output signal is then directed to the switching system 36. The logic subsystem 12 controls the switching system 36 such that the amplified data signal is then directed to the output lines 20. It will be understood that the logic subsystem 12 may perform other suitable functions without departing from the scope of the present invention.

FIG. 2 is a schematic diagram illustrating one embodiment of the stacked sense-amp cache memory system 10 illustrated in FIG. 1. The memory cell array 22 comprises a number of memory cells 40 arranged in an array of rows and columns. In the embodiment illustrated, the memory cells 40 are static random access memory (SRAM) cells constructed according to conventional principles of cross-coupled inverter realization. It will be understood that the memory cells 40 may be otherwise suitably constructed without departing from the scope of the present invention.

A wordline 42 is associated with each row of memory cells 40 and couples each memory cell 40 within the row to the row decoder 26. A complementary pair of bitlines 44a is associated with each column of memory cells 40. The bitlines 44a couple each memory cell 40 in each column to the precharge system 24 and the cache system 30. The complementary bitlines 44a are generally referred to as BIT and $\overline{\text{BIT}}$. In this embodiment, the data signal communicated on bitlines 44a is a complementary voltage. In other words, when BIT has a voltage corresponding to a logic state of "0," $\overline{\text{BIT}}$ will have a voltage corresponding to a logic state of "1."

The cache system 30 comprises one or more cache levels 35. In the embodiment illustrated in FIG. 2, only one cache level 35 is shown. The cache level 35 comprises a number of sense-amp control switches 50 and a number of sense-amp memory cells 52. The sense-amp control switch 50 is coupled to each set of bitlines 44a. A set of bitlines 44b are coupled from each sense-amp control switch 50 to the respective sense-amp memory cell 52 and to the column select system 32. A control line 54 also couples the sense-amp control switch 50 to the sense-amp memory cell 52. The sense-amp control switches 50 are coupled to the logic subsystem 12. The sense-amp control switch 50 operates to switch the data signals from the bitlines 44a to the bitlines 44b. It will be understood that the sense-amp control switches 50 may comprise other components or systems without departing from the scope of the present invention.

As will be described in greater detail below, each sense-amp memory cell 52 operates to sense the differential current on the bitlines 44b and store a data output signal corresponding to the sensed differential current. A cell output 56 couples each sense-amp memory cell 52 to the column select system 32. The stored data output signal in the sense-amp memory cell 52 is output to the column select system 32 over the cell output 56. In the embodiment illustrated, the sense-amp memory cell 52 stores a data output signal that does not require amplification. In another embodiment, not expressly illustrated, the data output signal stored in the sense-amp memory cell 52 must be amplified by, for example, the sense-amp system 34. It will be understood that the cache system 30 may comprise other devices and systems without departing from the scope of the present invention.

The column select system 32 comprises a column decoder 60, a number of column control switches 62, and a number of cell column switches 64. The column decoder 60 is coupled to the logic subsystem 12 and operates to receive and decode column address information for the requested data signal. The column control switches 62 are coupled to the column decoder 60 with an individual column control switch 62 coupled to each of the bitlines 44b. The column control switch 62 is "on" in that the column control switch 62 switches the data signal from a specific set of bitlines 44b to a corresponding set of bitlines 44c and the sense-amp system 34. The remaining column control switches 62 are "off" in that they do not switch the data signal from the bitlines 44b to the bitlines 44c.

The column select system 32 also comprises a number of memory cell column switches 64 coupled to the column decoder 60. The memory cell column switch 64 switches the data output signal from the sense-amp memory cell 52 to the switching system 36. The memory cell column switches 64 operate in conjunction with the bitline column switches 62. For example, each of the bitline column switches 62 and the memory cell column switches 64 are deactivated, or turned "off," with the exception of the specific column control switch 62 or memory cell column switch 64 corresponding to the column address of the requested data signal. It will be understood that the column select system 32 may comprise other devices or systems without departing from the scope of the present invention.

The sense-amp system 34 is coupled to the column select system 32 and the switching system 36. In this embodiment, the sense-amp system 34 comprises a number of sense amplifiers (not expressly shown). The sense amplifiers used in the sense-amp system 34 are generally not the same sense amplifiers used in the sense-amp memory cells 52. The sense-amp system 34 senses a differential current between the complementary bitlines 44c and produces an amplified data output signal based on the sensed differential current. The amplified data output signal from the sense-amp system 34 is communicated to the switching system 36. It will be understood that other types of suitable memory systems 10 do not require the data signal to be sensed and amplified prior to being output, it will be understood that the scope of the present invention encompasses such suitable memory systems.

The switching system 36 is coupled to the logic subsystem 12, the column select system 32, the sense-amp system 34, and the other system components (not expressly shown) by output lines 20. In one embodiment, the switching system 36 comprises an output switch 70 and an output memory cache 72. The output switch 70 is coupled to the memory cell column switches 64 and the sense-amp system 34. The output switch 70 switches between the outputs from the sense-amp system 34 or the memory cell column switches 64. The output from the output switch 70 is communicated to the optional output memory cache 72. The output memory cache 72 comprises one or more output memory cells (not expressly shown) that store the most recent data output signals. The output memory cache 72 operates in a similar manner to the cache system 30. The output memory cache 72 stores the most recent data output signals that correspond to the most recent row and column addresses accessed. When the row and column address of a requested data signal is the same as one stored in the output memory cache 72, the requested data output signal is accessed in the output memory cache 72 instead of activating the other components of the memory system 10. The requested data output signal is communicated to the other system components (not expressly shown) on output lines 20. It will be understood that the switching system 36 may comprise other devices and systems without departing from the scope of the present invention.

FIG. 3 is a schematic diagram of one embodiment of the sense-amp memory cell 52 shown in FIG. 2. The embodiment illustrated is a particular embodiment of a current-mirror type sense amplifier circuit. It will be understood that the sense-amp memory cell 52 may comprise other suitable embodiments of a sense amplifier circuit without departing from the scope of the present invention. For example, the sense amplifier circuit used in the sense-amp memory cell 52 may be a high speed sense amplifier circuit or other suitable sense amplifier circuit.

FIG. 3 illustrates one embodiment of the sense-amp memory cell 52. In the particular embodiment of the current-mirror type sense amplifier circuit, illustrated in FIG. 3, the BIT and $\overline{\text{BIT}}$ bitlines 44b are coupled to a pair of a pair of mirror image circuits coupled between a voltage supply VCC and N-channel sense amplifier control transistors 80a and 80b, respectively. The control transistors 80a and 80b are controlled by a control signal over the control line 54. The first mirror image circuit comprise a first, second, and third circuit path between the voltage supply VCC and the control transistor 80a. The first circuit path comprises a P-channel transistor 82a coupled in series with an N-channel transistor 84a. The second circuit path comprises a P-channel transistor 86a coupled in series with an N-channel transistor 88a. The third circuit path comprises a P-channel transistor 90a coupled in series with a P-channel transistor 92a in which the drain of the transistor 92a is coupled to the source of the transistor 88a.

Similarly, the second mirror image circuit comprise a first, second, and third circuit path between the voltage supply VCC and the control transistor 80b. The first circuit path comprises a P-channel transistor 82b coupled in series with an N-channel transistor 84b. The second circuit path comprises a P-channel transistor 86b coupled in series with an N-channel transistor 88b. The third circuit path comprises a P-channel transistor 90b coupled in series with a P-channel transistor 92b in which the drain of the transistor 92b is coupled to the source of the transistor 84b.

The BIT bitline 44b is coupled to the gates of transistors 84a and 88b, and the BIT bitline 44b is coupled to the gates of transistors 84b and 88a. The control line 54 is coupled to the gates of transistors 90a, 90b, 80a, and 80b. The inverse of control line 54 is coupled to the gates of transistors 92a and 92b through inventors 94 and 95. The cell output 56 comprises a BIT and $\overline{\text{BIT}}$ data limit. The BIT cell output 56 is coupled between transistors 82a and 84a. Similarly, the $\overline{\text{BIT}}$ cell output 56 is coupled between transistors 82b and 84b.

As discussed previously, the sense-amp memory cell 52 has been described with respect to a particular mirror current type sense amplifier circuit utilizing P-channel and N-channel transistors. The sense amplifier circuit may be suitable altered and remain within the scope of the present invention. For example, the sense amplifier circuit may be altered by replacing the P-channel transistors with N-channel transistors and the N-channel transistors with P-channel transistors and making the appropriate changes in the circuit to accommodate such changes.

Although the present invention has been described in several embodiments, various changes and modifications may be suggested to one skilled in the art. It is intended that the present invention encompass such changes and modifications that fall within the scope of the appended claims.

What is claimed is:

1. A stacked sense-amp cache memory system comprising:

a memory cell array comprising a plurality of memory cells arranged in rows and columns with each memory cell operable to store and output a data signal;

a cache system comprising a sense-amp memory cell coupled to each column of memory cells, the cache system operable to store the recently output data signals from each column of memory cells and output the data signals, the cache system also operable to output a stored data output signal that corresponds to a previously stored data signal;

a column select system coupled to the cache system, the column select system operable to select a single data signal or a single stored output data signal that corresponds to a specific column;

a sense-amp system coupled to the column select system, the sense-amp system operable to sense and amplify the selected data signal from the column select system and output an amplified data output signal; and a switching system coupled to the cache system and the sense-amp system, the switching system operable to output either the amplified data output signal or the stored data output signal.

2. The stacked sense-amp cache memory system of claim 1, wherein the cache system comprises a plurality of cache levels.

3. The stacked sense-amp cache memory system of claim 1, wherein each sense-amp memory cell comprises a current-mirror type sense amplifier circuit.

4. The stacked sense-amp cache memory system of claim 1, wherein the switching system comprises an output memory cache.

5. The stacked sense-amp cache memory system of claim 1, wherein the memory cell array comprises a plurality of static random access memory (SRAM) cells.

6. The stacked sense-amp cache memory system of claim 1, wherein the sense-amp system comprises at least one sense-amp.

7. An electronic device comprising, a stacked sense-amp cache memory system, the stacked sense-amp cache memory system comprising:

a memory cell array comprising a plurality of memory cells arranged in rows and columns with each memory cell operable to store and output a data signal;

a cache system comprising a sense-amp memory cell coupled to each column of memory cells, the cache system operable to store the recently output data signals from each column of memory cells and output the data signals, the cache system also operable to output a stored data output signal that corresponds to a previously stored data signal;

a column select system coupled to the cache system, the column select system operable to select a single data signal or a single stored output data signal that corresponds to a specific column;

a sense-amp system coupled to the column select system, the sense-amp system operable to sense and amplify the selected data signal from the column select system and output an amplified data output signal; and a switching system coupled to the cache system and the sense-amp system, the switching system operable to output either the amplified data output signal or the stored data output signal.

8. The electronic device of claim 7, wherein the cache system comprises a plurality of cache levels.

9. The electronic device of claim 7, wherein each sense-amp memory cell comprises a current-mirror type sense amplifier circuit.

10. The electronic device of claim 7, wherein the switching system comprises an output memory cache.

11. The electronic device of claim 7, wherein the memory cells are static random access memory (SRAM) cells.

12. The electronic device of claim 7, wherein the sense-amp system comprises at least one sense-amp.

13. A method of storing and retrieving information, comprising:

providing a memory cell array comprising a plurality of memory cells arranged in rows and columns with each memory cell operable to store and output a data signal;

storing data signals in the memory cell array with each data signal having an address that corresponds to the row and column of the memory cell that the data signal is stored within;

providing a cache system having a sense-amp memory cell coupled to each column of memory cells, the cache system operable to either store each of the recently output data signals from each column of memory cells and output the data signals, or, output a stored data output signal that corresponds to a previously stored data signal;

receiving a request for a data signal; and determining whether the requested data signal is stored in the cache system, when the requested data signal is stored in the cache system then a stored data output signal is output over an output line, otherwise, the requested data signal is obtained from the memory cell array and output over the output line.

14. The method of claim 13, further comprising:

providing an output cache memory operable to store recently output amplified data output signals and stored data output signals;

determining whether the requested data signal is stored in the output cache memory, when the requested data signal is stored in the output cache memory then a memory data output signal is output over the output line.

15. The method of claim 13, wherein the memory cells are static random access memory (SRAM) cells.

16. The method of claim 13, wherein the cache system comprises a plurality of cache levels.

17. The method of claim 13, wherein each sense-amp memory cell comprises a current-mirror type sense amplifier circuit.

* * * * *